US010910436B2

(12) United States Patent
Karpov et al.

(10) Patent No.: US 10,910,436 B2
(45) Date of Patent: Feb. 2, 2021

(54) ASYMMETRIC SELECTORS FOR MEMORY CELLS

(71) Applicant: Intel Corporation, Santa Clara, CA (US)

(72) Inventors: Elijah V. Karpov, Portland, OR (US); Prashant Majhi, San Jose, CA (US); Ravi Pillarisetty, Portland, OR (US); Niloy Mukherjee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 15 days.

(21) Appl. No.: 16/315,340

(22) PCT Filed: Sep. 24, 2016

(86) PCT No.: PCT/US2016/053605
§ 371 (c)(1),
(2) Date: Jan. 4, 2019

(87) PCT Pub. No.: WO2018/057014
PCT Pub. Date: Mar. 29, 2018

(65) Prior Publication Data

US 2019/0214433 A1 Jul. 11, 2019

(51) Int. Cl.

| | |
|---|---|
| ***H01L 27/24*** | (2006.01) |
| ***H01L 45/00*** | (2006.01) |
| ***G11C 13/00*** | (2006.01) |

(52) U.S. Cl.
CPC ...... *H01L 27/2409* (2013.01); *G11C 13/0002* (2013.01); *G11C 13/003* (2013.01); *H01L 27/2481* (2013.01); *H01L 45/1253* (2013.01); *H01L 45/16* (2013.01); *G11C 2213/55* (2013.01)

(58) Field of Classification Search
CPC .. H01L 27/2409; H01L 45/16; G11C 2213/55
See application file for complete search history.

(56) References Cited

U.S. PATENT DOCUMENTS

| | | | | |
|---|---|---|---|---|
| 7,796,494 | B2 | 9/2010 | Zhao et al. | |
| 8,289,752 | B2 | 10/2012 | Lu et al. | |
| 10,134,984 | B1 * | 11/2018 | Jo | H01L 45/1253 |
| 10,211,397 | B1 * | 2/2019 | Jo | H01L 45/085 |
| 2009/0168495 | A1 | 7/2009 | Aoki | |

(Continued)

FOREIGN PATENT DOCUMENTS

| | | |
|---|---|---|
| WO | 2016048330 A1 | 3/2016 |
| WO | 2018057014 A1 | 3/2018 |

OTHER PUBLICATIONS

International Search Report and Written Opinion issued in PCT/US2016/053605 dated Jun. 7, 2017; 12 pages.

*Primary Examiner* — Jay C Chang
*Assistant Examiner* — Mikka Liu
(74) *Attorney, Agent, or Firm* — Patent Capital Group

(57) ABSTRACT

Disclosed herein are asymmetric selectors for memory cells, and related devices and techniques. In some embodiments, a memory cell may include: a storage element; and a selector device coupled to the storage element, wherein the selector device has a positive threshold voltage and a negative threshold voltage, and a magnitude of the positive threshold voltage is different from a magnitude of the negative threshold voltage.

20 Claims, 5 Drawing Sheets

138
130
136
116
134
114
132
112
140

(56) References Cited

U.S. PATENT DOCUMENTS

| | | | |
|---|---|---|---|
| 2014/0008602 | A1 | 1/2014 | Karpov et al. |
| 2014/0209892 | A1 | 7/2014 | Kuo et al. |
| 2015/0137059 | A1 | 5/2015 | Chen et al. |
| 2015/0349251 | A1 | 12/2015 | Chang et al. |

* cited by examiner

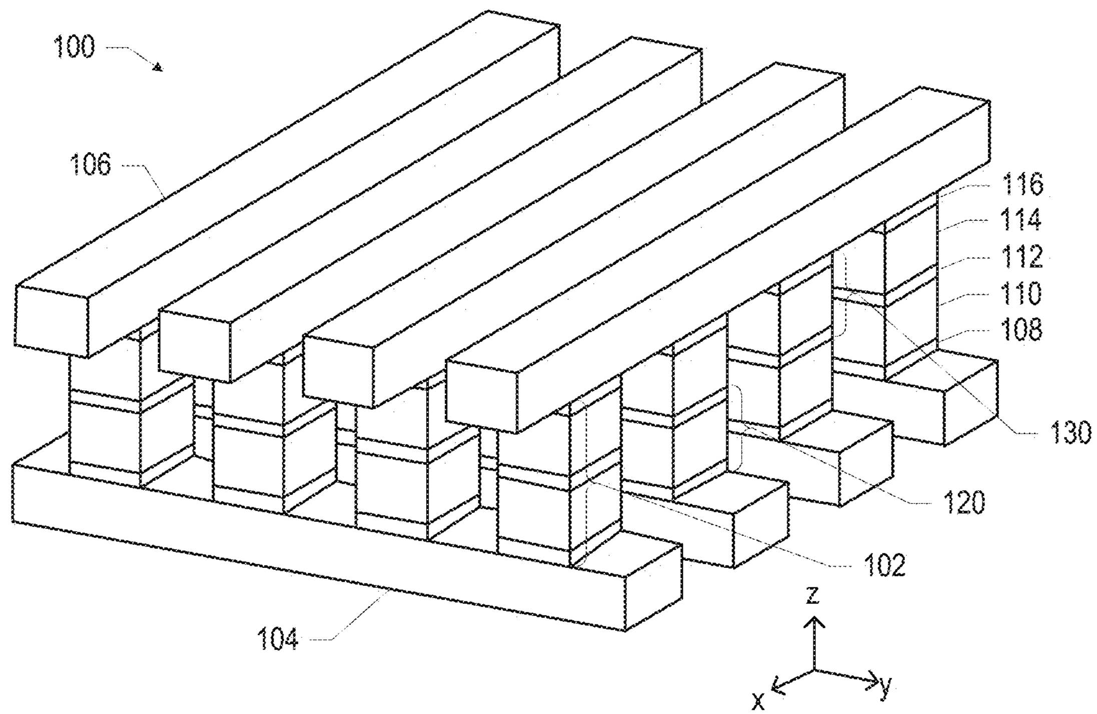
FIG. 1A
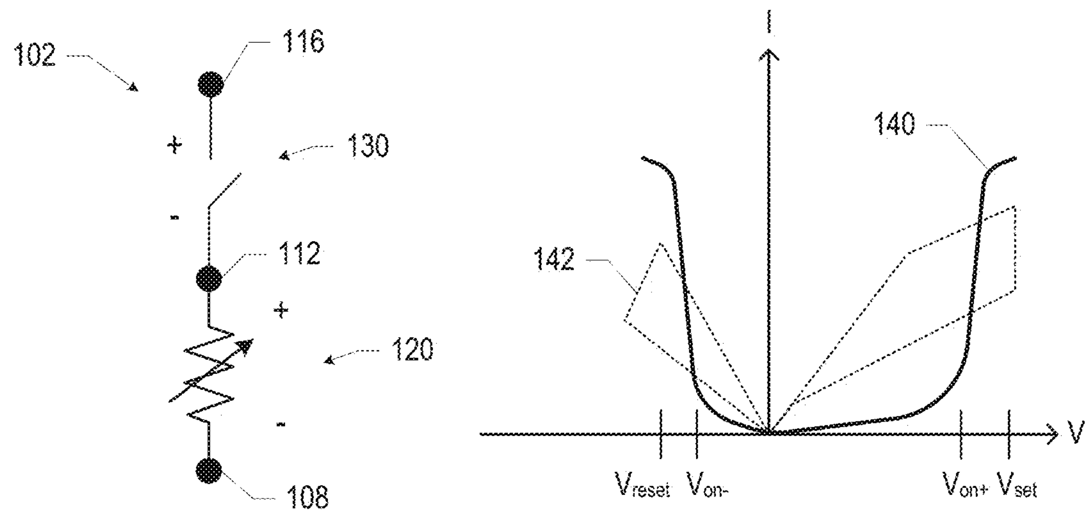
FIG. 1B
FIG. 1C

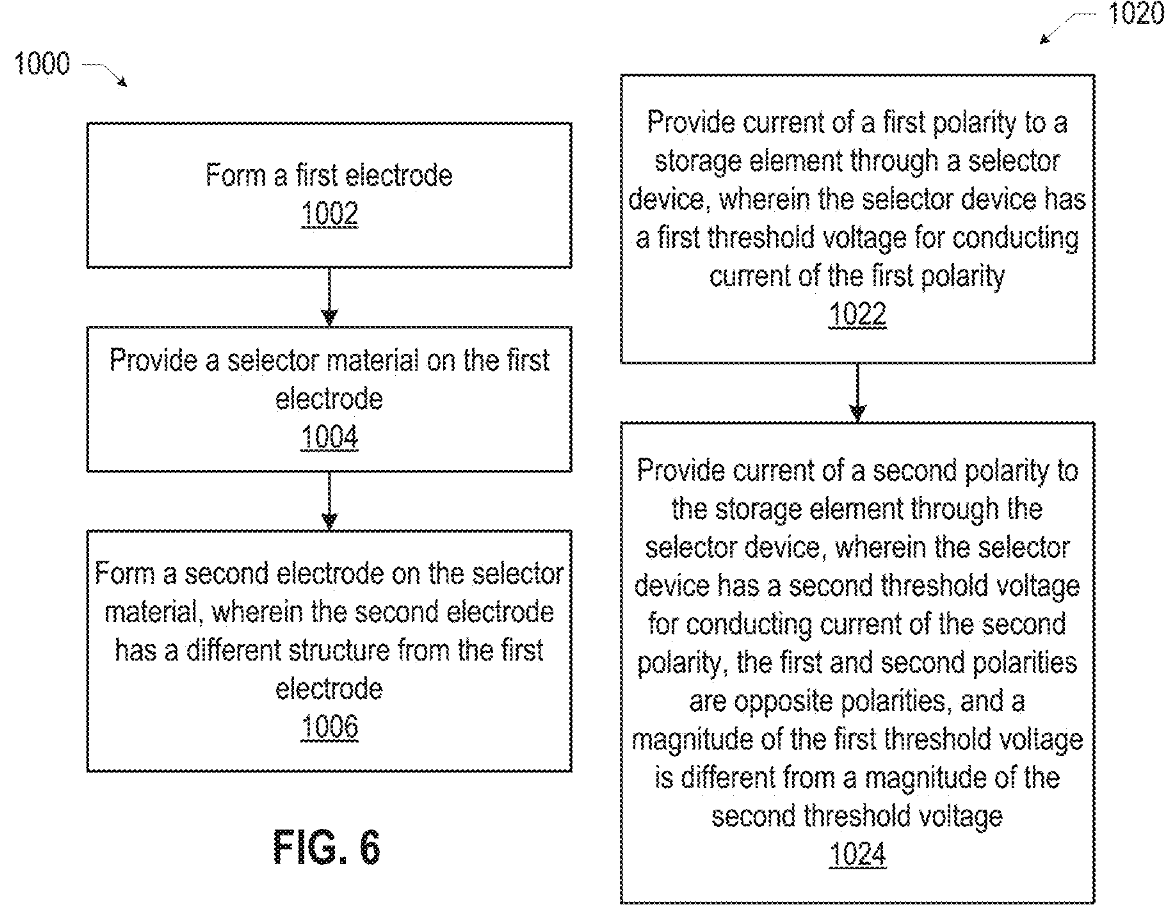
FIG. 6
FIG. 7
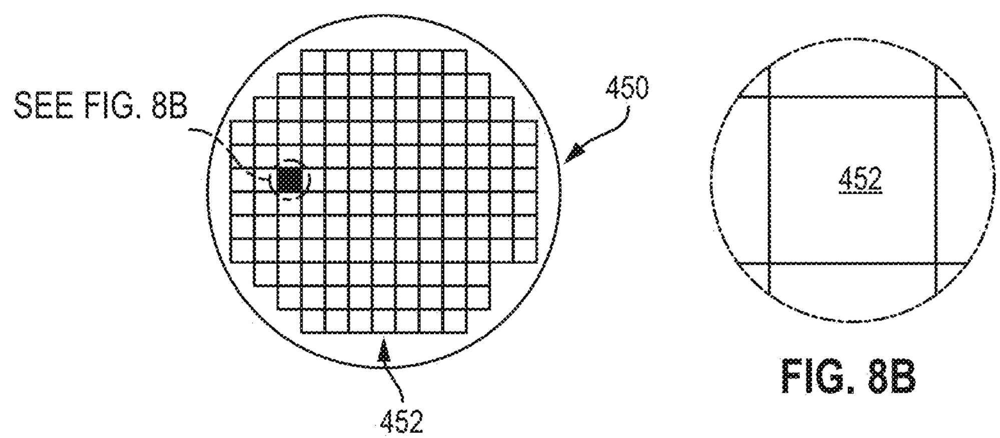
FIG. 8A
FIG. 8B

ASYMMETRIC SELECTORS FOR MEMORY CELLS

CROSS-REFERENCE TO RELATED APPLICATION

This application is a national stage application under 35 U.S.C. § 371 of PCT International Application Serial No. PCT/US2016/053605, filed on Sep. 24, 2016 and entitled "Asymmetric Selector for Memory Cells," which is hereby incorporated by reference herein in its entirety

BACKGROUND

A non-volatile random access memory (NVRAM) device is a memory device that retains its data in the absence of supplied power. Flash memory is an example of an existing NVRAM technology, but flash memory may be limited in its speed, endurance, area, and lifetime.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1A is a perspective view of a portion of a memory array including an asymmetric selector device, in accordance with various embodiments.

FIG. 1B is a schematic illustration of a memory cell of the memory array of FIG. 1A, in accordance with various embodiments.

FIG. 1C is a plot depicting example threshold voltages of the asymmetric selector device and the storage element of the memory cell of FIGS. 1A and 1B, in accordance with various embodiments.

FIG. 6 is a flow diagram of an illustrative method of manufacturing a memory cell including an asymmetric selector device, in accordance with various embodiments.

FIG. 7 is a flow diagram of an illustrative method of using a memory cell including an asymmetric selector device, in accordance with various embodiments.

FIGS. 8A and 8B are top views of a wafer and dies that may include any of the asymmetric selector devices or memory cells disclosed herein.

DETAILED DESCRIPTION

Figure 2:
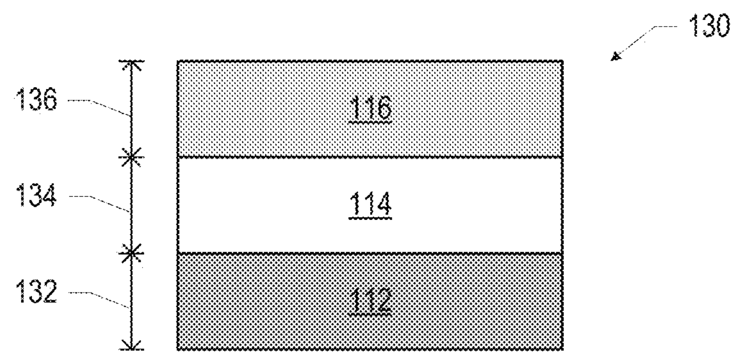
FIG. 2 is a cross-sectional view of an example asymmetric selector device, in accordance with various embodiments.

Disclosed herein are asymmetric selectors for memory cells, and related devices and techniques. In some embodiments, a memory cell may include: a storage element; and a selector device coupled to the storage element, wherein the selector device has a positive threshold voltage and a negative threshold voltage, and a magnitude of the positive threshold voltage is different from a magnitude of the negative threshold voltage.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The disclosure may use the singular term "layer," but the term "layer" should be understood to refer to assemblies that may include multiple different material layers. The accompanying drawings are not necessarily drawn to scale.

FIG. 1A is a perspective view of a portion of a memory array 100 including an asymmetric selector device 130, in accordance with various embodiments. The memory array 100 may be a cross-point array including memory cells 102 located at the intersections of conductive lines 104 and conductive lines 106. In some embodiments, the conductive lines 104 may be word lines and the conductive lines 106 may be bit lines, for example; for ease of discussion, this terminology may be used herein to refer to the conductive lines 104 and the conductive lines 106. In the embodiment illustrated in FIG. 1A, the word lines 104 may be parallel to each other and may be arranged perpendicularly to the bit lines 106 (which themselves may be parallel to each other), but any other suitable arrangement may be used. The word lines 104 and/or the bit lines 106 may be formed of any suitable conductive material, such as a metal (e.g., tungsten, copper, titanium, or aluminum). In some embodiments, the memory array 100 depicted in FIG. 1A may be a portion (e.g., a level) of a three-dimensional array in which other memory arrays like the memory array 100 of FIG. 1A are located at different levels (e.g., above or below the memory array 100).

Each memory cell 102 may include a storage element 120 coupled in series with an associated selector device 130. Generally, the storage element 120 may be programmed to a target data state (e.g., corresponding to a particular resistance state) by applying an electric field or energy (e.g., positive or negative voltage or current pulses) for a particular duration. In some embodiments, the storage element 120 may include a memory material 110 disposed between a pair of electrodes 108 and 112. The storage element 120 may be, for example, a resistive storage element that, during operation, switches between two different non-volatile states: a high resistance state (HRS) and a low resistance state (LRS). The state of a resistive storage element may be used to represent a data bit (e.g., a "1" for HRS and a "0" for LRS, or vice versa). A resistive storage element may have a voltage threshold beyond which the resistive storage element is in the LRS; driving a resistive storage element into the LRS may be referred to as SET (with an associated SET threshold voltage). Similarly, a resistive storage element may have a voltage threshold beyond which the resistive storage element is in the HRS; driving a resistive storage element into the HRS may be referred to as RESET (with an associated RESET threshold voltage).

The storage element 120 may be, for example, a resistive random access memory (RRAM) device; in such embodiments, the memory material 110 may include an oxygen exchange layer (e.g., hafnium) and an oxide layer, as known in the art. The storage element 120 may be, for example, a metal filament memory device (e.g., a conductive bridging random access memory (CBRAM) device); in such embodiments, the memory material 110 may include a solid electrolyte, one of the electrodes 108 and 112 may be an electrochemically active metal (e.g., silver or copper), and the other of the electrodes 108 and 112 may be an inert metal, as known in the art. A chemical barrier layer (e.g., tantalum, tantalum nitride, or tungsten) may be disposed between the electrochemically active metal electrode and the solid electrolyte to mitigate diffusion of the electrochemically active metal into the solid electrolyte, in some such embodiments. In some embodiments, the storage element 120 may be a phase change memory (PCM) device; in such embodiments, the memory material 110 may include a chalcogenide or other phase change memory material.

The selector device 130 may be a two-terminal device that may act as a bipolar switch, controlling the flow of current through the storage element 120. In some embodiments, the selector device 130 may include a selector material 114 disposed between a pair of electrodes 112 and 116. Note that, in the embodiment illustrated in FIG. 1A, the electrode 112 of the selector device 130 is "shared" with the storage element 120 in that the electrode 112 acts as an electrode for the selector device 130 and for the storage element 120. In other embodiments of the memory cell 102, the selector device 130 may not share any electrodes with the storage element 120. During manufacture of the memory cell 102, the selector device 130 may be fabricated before or after the storage element 120 is fabricated. Various embodiments of the selector device 130 are discussed in detail below.

As illustrated in the schematic view in FIG. 1B of the memory cell 102, when the selector device 130 is in a conductive state, the "switch" may be closed; when the selector device 130 is in a non-conductive state, the "switch" may be open. The state of the selector device 130 may change in response to the voltage applied across the selector device 130. In particular, as illustrated in FIG. 1C, the selector device 130 may be in a non-conductive state when the voltage across the selector device 130 is between the negative threshold voltage Von- and the positive threshold voltage Von+. When the voltage across the selector device 130 reaches and exceeds the positive threshold voltage Von+, the selector device 130 may conduct current of a positive polarity; similarly, when the voltage across the selector device reaches and drops below the negative threshold voltage Von−, the selector device 130 may conduct current of a negative polarity. The selector device 130 may thus act as a bipolar switch, controlling the flow of current in positive and negative directions in accordance with respective positive and negative thresholds.

Further, the selector device 130 may be asymmetric in that the magnitude of the positive threshold voltage Von+ is different from the magnitude of the negative threshold voltage Von−. FIG. 1C depicts an embodiment in which the magnitude of the positive threshold voltage Von+ is greater than the magnitude of the negative threshold voltage Von−, but in other embodiments of the selector devices 130 disclosed herein, the magnitude of the negative threshold voltage Von− may be greater than the magnitude of the positive threshold voltage Von+.

Selector devices used in conventional memory cells do not exhibit such asymmetry; instead, the negative and positive threshold voltages have the same magnitude. Such symmetric selectors, however, may not be well matched to storage elements 120 that themselves exhibit asymmetric behavior. For example, some storage elements 120 may have a SET threshold voltage whose magnitude is greater than or less than the magnitude of the RESET threshold voltage. FIG. 1C depicts such an example, showing an example dotted I-V curve 142 for an RRAM storage element 120 with a positive SET threshold voltage Vset that has a magnitude greater than the magnitude of the negative RESET threshold voltage Vreset. Note that, in other embodiments of storage elements 120, the magnitude of the SET threshold voltage Vset may be less than the magnitude of the RESET voltage Vreset, and/or the polarities of the SET and RESET threshold voltages may be reversed from the polarities illustrated in FIG. 1C.

The asymmetric selector devices 130 disclosed herein may advantageously match asymmetric storage elements 120, resulting in improved performance and decreased power consumption relative to conventional memory cells. For example, if the asymmetric selector device 130 were replaced in the memory cell 102 with a conventional symmetric selector device having positive and negative thresholds Von with magnitudes both equal to Von+ of FIG. 1C, the storage element 120 (whose I-V curve is also illustrated in FIG. 1C) would be overdriven during RESET because a voltage with magnitude much greater than Vreset would be needed to cause the selector device to conduct. Overdriving a storage element 120 may result in permanent damage and/or a reduced lifetime for the storage element 120. Additionally, sourcing more voltage/current than is needed may act as a power drain that prevents or limits the use of such memory cells in low voltage applications. Conversely, if the asymmetric selector device 130 were replaced in the memory cell with a conventional symmetric selector device having positive and negative thresholds Von with magnitudes both equal to Von− of FIG. 1C, the storage element 120 would be underdriven during SET, and thus the storage element 120 may not reach its SET threshold voltage Vset at all. By contrast, the asymmetric selector devices 130 disclosed herein may be constructed to exhibit threshold voltages that are well-matched to the associated storage elements 120, reducing energy consumption and improving device performance.

Figure 3:
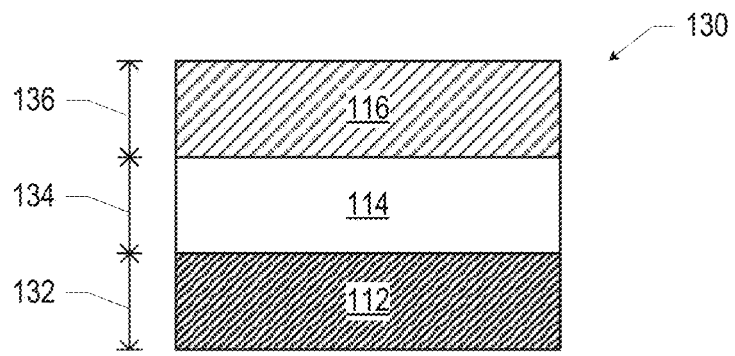
FIG. 3 is a cross-sectional view of another example asymmetric selector device, in accordance with various embodiments.

The asymmetric selector devices 130 disclosed herein, and the associated memory cells 102, may take any of a number of forms. For example, FIGS. 2 and 3 are cross-sectional views of embodiments of the selector device 130 in which the electrode 116 and the electrode 112 are formed of different materials. In particular, FIG. 2 illustrates an embodiment of a selector device 130 in which the electrode 116 and the electrode 112 have different work functions. The use of electrodes 116 and 118 with different work functions may result in a "built-in" electric field across the selector material 114 (e.g., a dielectric material). The greater this built-in electric field, the greater the asymmetry in the I-V characteristic of the selector device 130 because the actual voltage across the selector material 114 is the sum of the built-in electric field and any externally applied electric field. In particular, the work functions of the surfaces of the electrodes 116 and 112 facing the selector material 114 may be different. In some embodiments of the selector device 130 of FIG. 2, the electrode 116 (the electrode 112) may be formed of tantalum, and the electrode 112 (the electrode 116) may be formed of platinum. In some embodiments of the selector device 130 of FIG. 2, the electrode 116 (the electrode 112) may be formed of hafnium, and the electrode 112 (the electrode 116) may be formed of cobalt. In some embodiments of the selector device 130 of FIG. 2, the electrode 116 (the electrode 112) may be formed of indium, and the electrode 112 (the electrode 116) may be formed of iridium. Any other suitable pair of materials may be used to provide electrodes 112 and 116 having different work functions. For example, low and high work function materials may include conductive compounds, such as conductive nitrides (e.g., tantalum nitride and titanium nitride).

The thicknesses of the materials included in the asymmetric selector device 130 of FIG. 2 may take any suitable values. For example, in some embodiments, the electrode 112 may have a thickness 132 between 3 and 100 nanometers, the selector material 114 may have a thickness 134 between 2 and 50 nanometers, and the electrode 116 may have a thickness 136 between 3 and 100 nanometers.

FIG. 3 illustrates an embodiment of a selector device 130 in which the electrode 116 and the electrode 112 have different electrochemical activity. Different electrochemical activity may result in a different ionic current for positive and negative biases. Although such asymmetric ionic currents may be low, they may significantly affect atomic configurations and corresponding electric current, resulting in an asymmetric I-V characteristic for the selector device 130. In some embodiments of the selector device 130 of FIG. 3, the electrode 116 (the electrode 112) may be formed of copper, and the electrode 112 (electrode 116) may be formed of an inert material. Examples of inert materials that may be used in various embodiments may include platinum, ruthenium, iridium, palladium, carbon, and tungsten, among others. The thicknesses of the materials included in the asymmetric selector device 130 of FIG. 3 may take any of the values discussed above with reference to FIG. 2.

Figure 4:
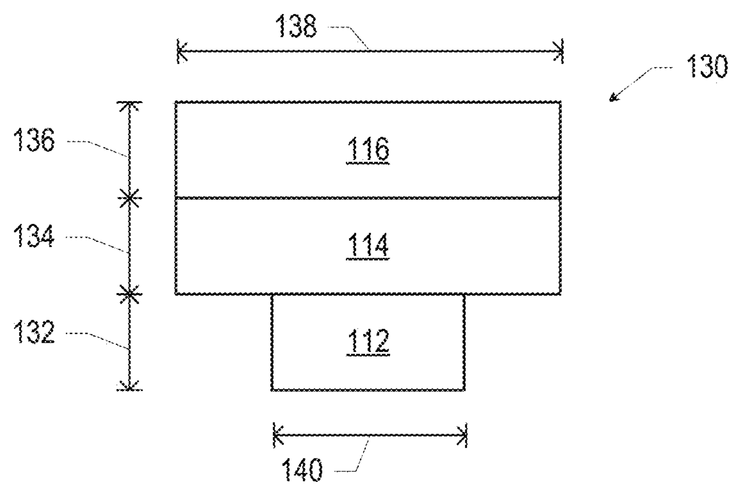
FIG. 4 is a cross-sectional view of another example asymmetric selector device, in accordance with various embodiments.

In some embodiments of the asymmetric selector devices 130 disclosed herein, the materials of the electrodes 112 and 116 may or may not be the same, but the geometries of the electrodes 112 and 116 may differ. For example, FIG. 4 illustrates an embodiment of a selector device 130 in which the faces of the electrode 116 and the electrode 112 facing the selector material 114 have different surface areas. The different areas of the electrodes 116 and 112 may result in different injection currents, which may in turn result in different current densities and corresponding threshold voltages. Although FIG. 4 illustrates the electrode 116 as having a larger surface area than the electrode 112, the sizes of the electrodes 112 and 116 may be reversed as desired. The effect of electrode area on the threshold voltages of a selector device 130 may depend on the particular materials of the selector device 130; for example, in some embodiments, a smaller electrode 116 may be associated with a larger positive threshold voltage. Similarly, for some materials, a smaller electrode 118 may be associated with a larger negative threshold voltage. The thicknesses of the materials included in the asymmetric selector device 130 of FIG. 4 may take any of the values discussed above with reference to FIG. 2.

In some embodiments, the electrodes 112 and 116 may have cross-sectional widths 140 and 138, respectively. The electrodes 112 and 116 may have footprints with any suitable shape, such as square, rectangular, or circular footprints. The cross-sectional width of the selector material 114 may be between 5 nanometers and 50 nanometers, in some embodiments. In some embodiments, a ratio of the area of the larger one of the electrodes 112/116 to the area of the smaller one of the electrodes 112/116 may be between 1 and 100.

Any suitable material may provide the selector material 114 of the asymmetric selector devices 130 discussed above with reference to FIGS. 2-4. For example, in some embodiments, the selector material 114 may be an oxide material (e.g., niobium oxide) that may be capable of undergoing an insulator-to-metal transition in response to an applied voltage or resistance. In some embodiments, the selector material 114 may be a non-oxide material, such as a chalcogenide material, a multi-component material including group-IV or group-VI elements, such as silicon and tellurium. In some embodiments, the selector material 114 may be an oxide or chalcogenide material with at least one of the electrodes 112/116 fabricated from a material with high solubility in the oxide or chalcogenide (such as copper or silver). The selector material 114 may include multiple material layers, as suitable and as known in the art. In some embodiments, the selector device 130 may include barrier layer(s) providing a diffusion barrier between the electrode 112/electrode 116 and the selector material. In some embodiments, the selector material 114 and the memory material 110 may have the same material composition; in other embodiments, the selector material 114 and the memory material 110 may be different materials.

Figure 5:
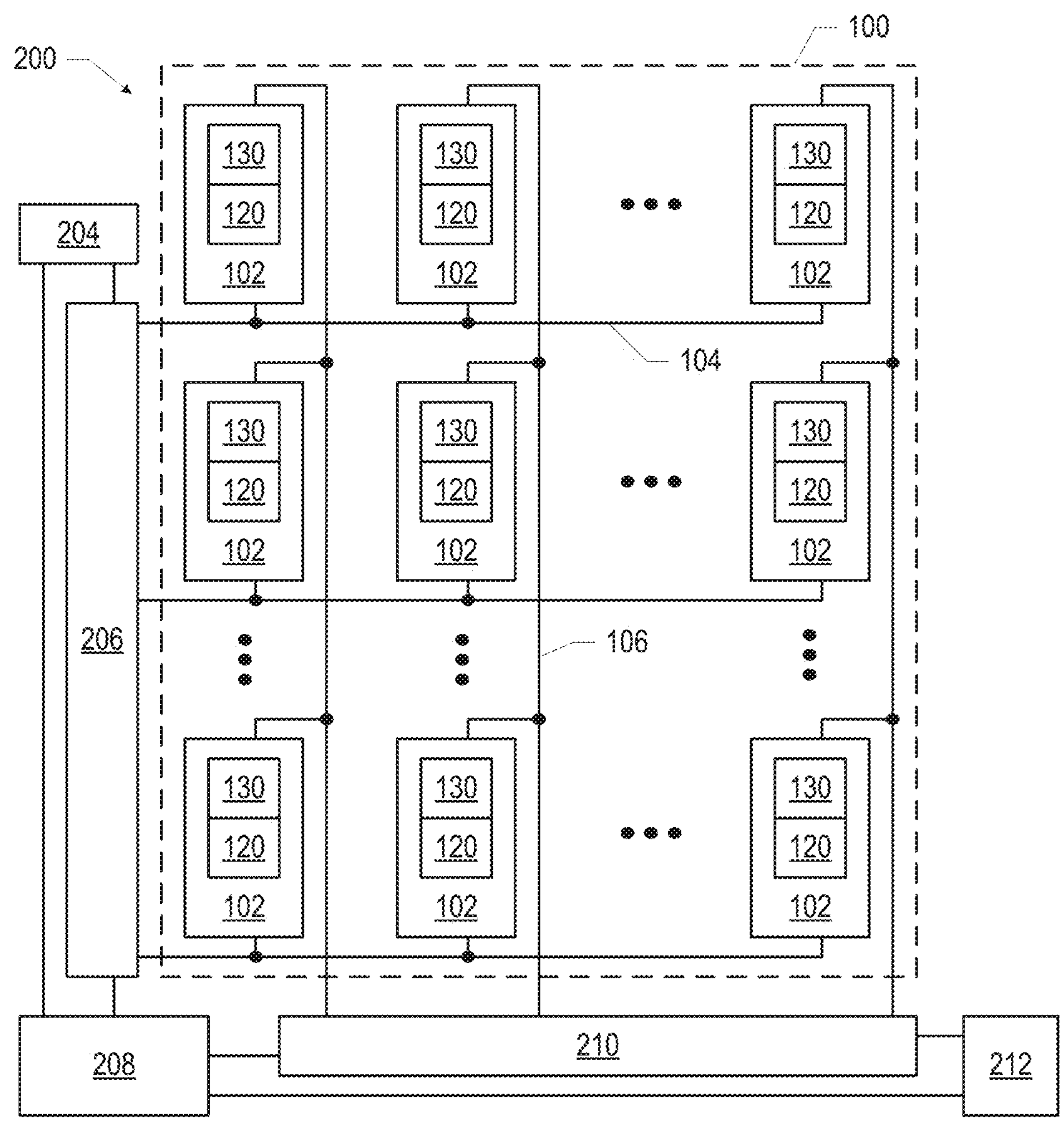
FIG. 5 is a schematic illustration of a memory device including asymmetric selector devices, in accordance with various embodiments.

A memory array 100 including an asymmetric selector device 130 may be controlled in any suitable manner. For example, FIG. 5 is a schematic illustration of a memory device 200 including a memory array 100 having memory cells 102 with storage elements 120 and asymmetric selector devices 130, in accordance with various embodiments. As discussed above, each memory cell 102 may include a storage element 120 connected in series with any of the embodiments of the asymmetric selector devices 130 disclosed herein. The memory device 200 of FIG. 5 may be a bidirectional cross-point array in which each column is associated with a bit line 106 driven by column select circuitry 210. Each row may be associated with a word line 104 driven by row select circuitry 206. During operation, read/write control circuitry 208 may receive memory access requests (e.g., from one or more processing devices or communication chips of a computing device, such as the computing device 2000 discussed below), and may respond by generating an appropriate control signal (e.g., read, write 0, or write 1), as known in the art. The read/write control circuitry 208 may control the row select circuitry 206 and the column select circuitry 210 to select the desired memory cell(s) 102. Voltage supplies 204 and 212 may be controlled to provide the voltage(s) necessary to bias the memory array 100 to facilitate the requested action on one or more memory cells 102. Row select circuitry 206 and column select circuitry 210 may apply appropriate voltages across the memory array 100 to access the selected memory cells 102 (e.g., by providing appropriate voltages to the memory cells 102 to allow the desired selector devices 130 to conduct). Row select circuitry 206, column select circuitry 210, and read/write control circuitry 208 may be implemented using any devices and techniques known in the art.

Any suitable techniques may be used to manufacture the selector devices 130 and memory cells 102 disclosed herein. FIG. 6 is a flow diagram of an illustrative method 1000 of manufacturing an asymmetric selector device, in accordance with various embodiments. Although the operations discussed below with reference to the method 1000 are illustrated in a particular order and depicted once each, these operations may be repeated or performed in a different order (e.g., in parallel), as suitable. Additionally, various operations may be omitted, as suitable. Various operations of the method 1000 may be illustrated with reference to one or more of the embodiments discussed above, but the method 1000 may be used to manufacture any suitable asymmetric selector device (including any suitable ones of the embodiments disclosed herein).

At 1002, a first electrode may be formed (e.g., by physical vapor deposition (PVD), such as sputtering). For example, the electrode 112 may be formed on memory material 110 of a storage element 120. The first electrode may take any of the forms disclosed herein.

At 1004, a selector material may be provided on the first electrode (e.g., by PVD or atomic layer deposition (ALD). For example, the selector material 114 may be provided on the electrode 112. The selector material may take any of the forms disclosed herein.

At 1006, a second electrode may be formed on the selector material. The second electrode may have a different structure from the first electrode. In some embodiments, the second electrode may have a different surface area, material composition, electrochemical reactivity, and/or work function from the first electrode. For example, the electrode 116 may be formed on the selector material 114, and may have a different structure from the electrode 112, as discussed above with reference to any of FIGS. 2-4.

FIG. 7 is a flow diagram of an illustrative method 1020 of operating a memory cell, in accordance with various embodiments. Although the operations discussed below with reference to the method 1020 are illustrated in a particular order and depicted once each, these operations may be repeated or performed in a different order (e.g., in parallel), as suitable. Additionally, various operations may be omitted, as suitable. Various operations of the method 1020 may be illustrated with reference to one or more of the embodiments discussed above, but the method 1020 may be used to operate any suitable memory cell (including any suitable ones of the embodiments disclosed herein).

At 1022, current of a first polarity may be provided to a storage element through a selector device. The selector device may have a first threshold voltage for conducting current of the first polarity. For example, positive (negative) current may be provided to a storage element 120 through a selector device 130, and the selector device 130 may have a positive threshold voltage Von+ (negative threshold voltage Von−).

At 1024, current of a second polarity may be provided to the storage element through the selector device. The selector device may have a second threshold voltage for conducting current of the second polarity, the first and second polarities may be opposite polarities, and a magnitude of the first threshold voltage may be different from a magnitude of the second threshold voltage. For example, negative (positive) current may be provided to the storage element 120 through a selector device 130, the selector device 130 may have a negative threshold voltage Von− (positive threshold voltage Von+), and the magnitude of Von− may be different from the magnitude of Von+.

The asymmetric selector devices 130 and memory cells 102 disclosed herein may be included in any suitable electronic device. FIGS. 8A-B are top views of a wafer 450 and dies 452 that may be formed from the wafer 450; the dies 452 may include any of the asymmetric selector devices 130 or memory cells 102 disclosed herein. The wafer 450 may include semiconductor material and may include one or more dies 452 having integrated circuit elements (e.g., asymmetric selector devices 130 and storage elements 120) formed on a surface of the wafer 450. Each of the dies 452 may be a repeating unit of a semiconductor product that includes any suitable device (e.g., the memory device 200). After the fabrication of the semiconductor product is complete, the wafer 450 may undergo a singulation process in which each of the dies 452 is separated from one another to provide discrete "chips" of the semiconductor product. A die 452 may include one or more asymmetric selector devices 130 or memory cells 102 and/or supporting circuitry to route electrical signals to the asymmetric selector devices 130 or memory cells 102 (e.g., interconnects including conductive lines 104 and 106), as well as any other IC components. In some embodiments, the wafer 450 or the die 452 may include other memory devices, logic devices (e.g., AND, OR, NAND, or NOR gates), or any other suitable circuit element. Multiple ones of these devices may be combined on a single die 452. For example, a memory device formed by multiple memory arrays (e.g., multiple memory arrays 100) may be formed on a same die 452 as a processing device (e.g., the processing device 2002 of FIG. 10) or other logic that is configured to store information in the memory devices or execute instructions stored in the memory array.

Figure 9:
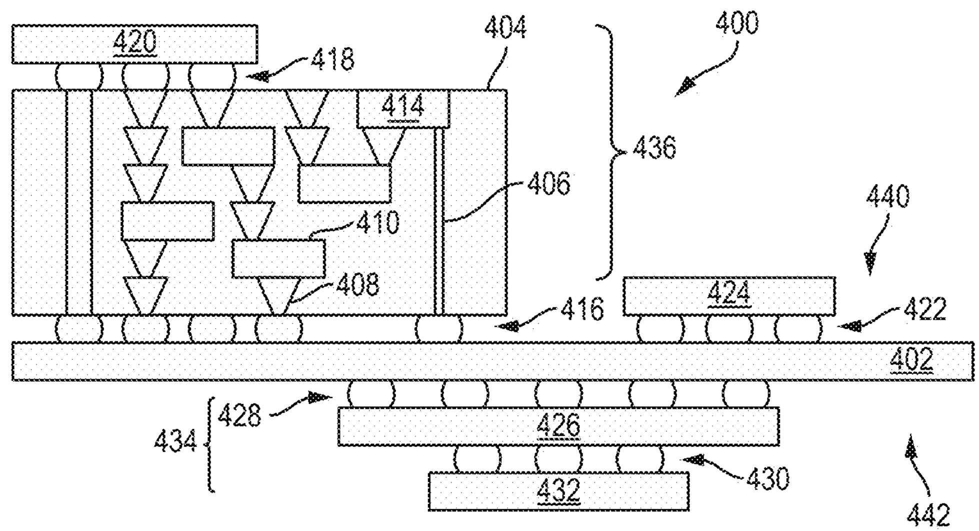
FIG. 9 is a cross-sectional side view of a device assembly that may include any of the asymmetric selector devices or memory cells disclosed herein.

FIG. 9 is a cross-sectional side view of a device assembly 400 that may include any of the asymmetric selector devices 130 or memory cells 102 disclosed herein in one or more packages. A "package" may refer to an electronic component that includes one or more IC devices that are structured for coupling to other components; for example, a package may include a die coupled to a package substrate that provides electrical routing and mechanical stability to the die. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board.

The device assembly 400 illustrated in FIG. 9 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls, male and female portions of a socket, an adhesive, an underfill material, and/or any other suitable electrical and/or mechanical coupling structure.

The package-on-interposer structure 436 may include a package 420 coupled to an interposer 404 by coupling components 418. The coupling components 418 may take any suitable form for the application, such as the forms discussed above with reference to the coupling components 416. Although a single package 420 is shown in FIG. 9, multiple packages may be coupled to the interposer 404; indeed, additional interposers may be coupled to the interposer 404. The interposer 404 may provide an intervening substrate used to bridge the circuit board 402 and the package 420. The package 420 may include one or more asymmetric selector devices 130 or memory cells 102, for example. Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 9, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices (e.g., the asymmetric selector devices 130 or memory cells 102). More complex devices such as radio-frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420. The package 424 may include one or more asymmetric selector devices 130 or memory cells 102, for example.

The device assembly 400 illustrated in FIG. 9 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. The coupling components 428 and 430 may take the form of any of the embodiments of the coupling components 416 discussed above, and the packages 426 and 432 may take the form of any of the embodiments of the package 420 discussed above. Each of the packages 426 and 432 may include one or more asymmetric selector devices 130 or memory cells 102, for example.

Figure 10:
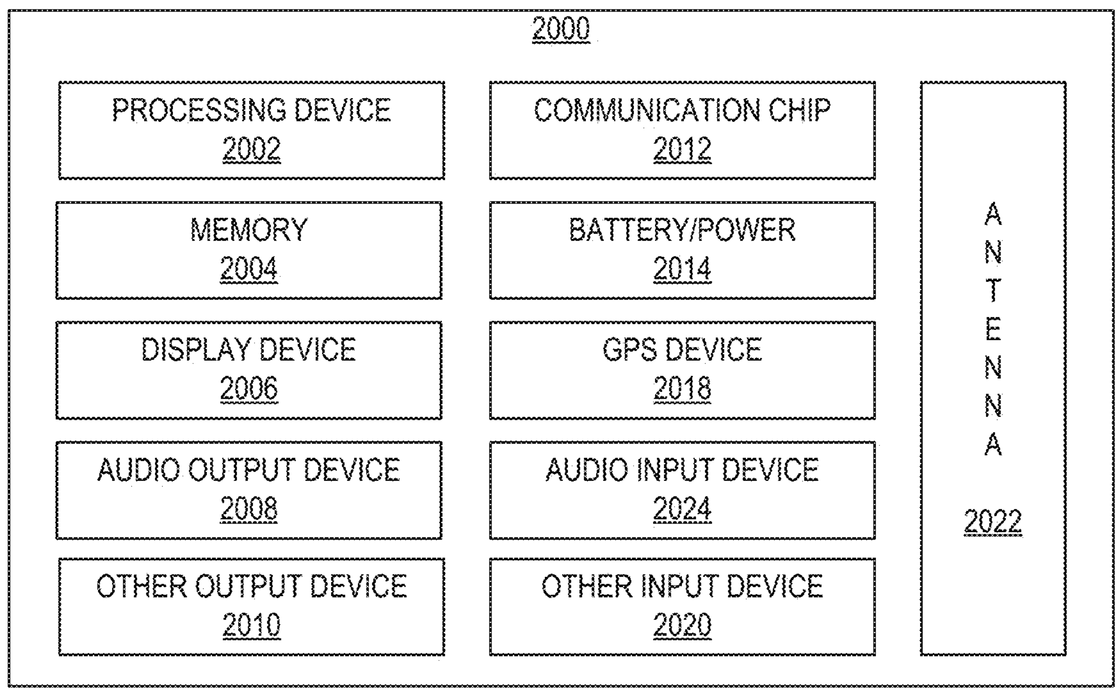
FIG. 10 is a block diagram of an example computing device that may include any of the asymmetric selector devices or memory cells disclosed herein, in accordance with various embodiments.

FIG. 10 is a block diagram of an example computing device 2000 that may include any of the asymmetric selector devices 130 or memory cells 102 disclosed herein. A number of components are illustrated in FIG. 10 as included in the computing device 2000, but any one or more of these components may be omitted or duplicated, as suitable for the application. In some embodiments, some or all of the components included in the computing device 2000 may be attached to one or more printed circuit boards (e.g., a motherboard). In some embodiments, various ones of these components may be fabricated onto a single system-on-a-chip (SoC) die. Additionally, in various embodiments, the computing device 2000 may not include one or more of the components illustrated in FIG. 10, but the computing device 2000 may include interface circuitry for coupling to the one or more components. For example, the computing device 2000 may not include a display device 2006, but may include display device interface circuitry (e.g., a connector and driver circuitry) to which a display device 2006 may be coupled. In another set of examples, the computing device 2000 may not include an audio input device 2024 or an audio output device 2008, but may include audio input or output device interface circuitry (e.g., connectors and supporting circuitry) to which an audio input device 2024 or audio output device 2008 may be coupled.

The computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may interface with one or more of the other components of the computing device 2000 (e.g., the communication chip 2012 discussed below, the display device 2006 discussed below, etc.) in a conventional manner. The processing device 2002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The computing device 2000 may include a memory 2004, which may itself include one or more memory devices such as volatile memory (e.g., dynamic random access memory (DRAM)), non-volatile memory (e.g., read-only memory (ROM)), flash memory, solid state memory, and/or a hard drive. The memory 2004 may include one or more asymmetric selector devices 130 or memory cells 102 or memory arrays 100 or memory devices 200, as disclosed herein. In some embodiments, the memory 2004 may include memory that shares a die with the processing device 2002. This memory may be used as cache memory and may include embedded dynamic random access memory (eDRAM) or spin transfer torque magnetic random-access memory (STT-MRAM).

In some embodiments, the computing device 2000 may include a communication chip 2012 (e.g., one or more communication chips). For example, the communication chip 2012 may be configured for managing wireless communications for the transfer of data to and from the computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as GPS, EDGE, GPRS, CDMA, WiMAX, LTE, EV-DO, or others. In some embodiments, a first communication chip 2012 may be dedicated to wireless communications, and a second communication chip 2012 may be dedicated to wired communications.

The computing device 2000 may include battery/power circuitry 2014. The battery/power circuitry 2014 may include one or more energy storage devices (e.g., batteries or capacitors) and/or circuitry for coupling components of the computing device 2000 to an energy source separate from the computing device 2000 (e.g., AC line power).

The computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The computing device 2000 may include an audio output device 2008 (or corresponding interface circuitry, as discussed above). The audio output device 2008 may include any device that generates an audible indicator, such as speakers, headsets, or earbuds, for example.

The computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The computing device 2000 may include a global positioning system (GPS) device 2018 (or corresponding interface circuitry, as discussed above). The GPS device 2018 may be in communication with a satellite-based system and may receive a location of the computing device 2000, as known in the art.

The computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide various examples of the embodiments disclosed herein.

Example 1 is a memory cell, including: a storage element; and a selector device coupled to the storage element, wherein the selector device has a positive threshold voltage and a negative threshold voltage, and a magnitude of the positive threshold voltage is different from a magnitude of the negative threshold voltage.

Example 2 may include the subject matter of Example 1, and may further specify that the storage element has a positive threshold voltage and a negative threshold voltage, and a magnitude of the positive threshold voltage of the storage element is different from a magnitude of the negative threshold voltage of the storage element.

Example 3 may include the subject matter of Example 2, and may further specify that: when the magnitude of the positive threshold voltage of the selector device is greater than the magnitude of the negative threshold voltage of the selector device, the magnitude of the positive threshold voltage of the storage element is greater than the magnitude of the negative threshold voltage of the storage element; and when the magnitude of the positive threshold voltage of the selector device is less than the magnitude of the negative threshold voltage of the selector device, the magnitude of the positive threshold voltage of the storage element is less than the magnitude of the negative threshold voltage of the storage element.

Example 4 may include the subject matter of Example 2, and may further specify that the magnitude of the positive threshold voltage of the selector device is less than the magnitude of the positive threshold voltage of the storage element.

Example 5 may include the subject matter of Example 4, and may further specify that the magnitude of the negative threshold voltage of the selector device is less than the magnitude of the negative threshold voltage of the storage element.

Example 6 may include the subject matter of any of Examples 1-5, and may further specify that the selector device includes first and second electrodes, a selector material is disposed between the first and second electrodes, and the first and second electrodes have different structures.

Example 7 may include the subject matter of Example 6, and may further specify that faces of the first and second electrodes facing the selector material have different surface areas.

Example 8 may include the subject matter of any of Examples 6-7, and may further specify that the first and second electrodes are formed of different materials.

Example 9 may include the subject matter of any of Examples 6-8, and may further specify that faces of the first and second electrodes facing the selector material have different work functions.

Example 10 may include the subject matter of Example 9, and may further specify that the first electrode is tantalum and the second electrode is platinum.

Example 11 may include the subject matter of Example 9, and may further specify that the first electrode is hafnium and the second electrode is cobalt.

Example 12 may include the subject matter of Example 9, and may further specify that the first electrode is indium and the second electrode is iridium.

Example 13 may include the subject matter of any of Examples 6-12, and may further specify that one of the first and second electrodes is copper, and an other of the first and second electrodes is non-copper material.

Example 14 may include the subject matter of Example 13, and may further specify that the non-copper material is tungsten or platinum.

Example 15 may include the subject matter of any of Examples 6-14, and may further specify that faces of the first and second electrodes facing the selector material have different surface areas, and the first and second electrodes are formed of different materials.

Example 16 may include the subject matter of any of Examples 6-15, and may further specify that the selector material includes a chalcogenide.

Example 17 may include the subject matter of any of Examples 6-16, and may further specify that the first or second electrode provides an electrode of the storage element.

Example 18 may include the subject matter of any of Examples 1-17, and may further specify that the storage element is a resistive random access memory (RRAM) device.

Example 19 may include the subject matter of any of Examples 1-17, and may further specify that the storage element is a metal filament storage element.

Example 20 may include the subject matter of any of Examples 1-19, and may further specify that the memory cell includes a first terminal coupled to a bit line, and the memory cell includes a second terminal coupled to a word line.

Example 21 is a method of manufacturing a selector device, including: forming a first electrode; providing a selector material on the first electrode; and forming a second electrode on the selector material, wherein the second electrode has a different structure from the first electrode.

Example 22 may include the subject matter of Example 21, and may further specify that faces of the first and second electrodes facing the selector material have different surface areas.

Example 23 may include the subject matter of any of Examples 21-22, and may further specify that the first and second electrodes are formed of different materials.

Example 24 may include the subject matter of any of Examples 21-23, and may further include forming a storage element in series with the selector device.

Example 25 may include the subject matter of Example 24, and may further specify that the first electrode is part of the storage element.

Example 26 may include the subject matter of Example 24, and may further specify that the second electrode is part of the storage element.

Example 27 is a method of operating a memory cell, including: providing current of a first polarity to a storage element through a selector device, wherein the selector device has a first threshold voltage for conducting current of the first polarity; and providing current of a second polarity to the storage element through the selector device, wherein the selector device has a second threshold voltage for conducting current of the second polarity; wherein the first and second polarities are opposite polarities, and a magnitude of the first threshold voltage is different from a magnitude of the second threshold voltage.

Example 28 may include the subject matter of Example 27, and may further specify that the selector device is a two-terminal device in series with the storage element.

Example 29 may include the subject matter of any of Examples 27-28, and may further specify that current of the first and second polarities is provided in response to row and column memory array control signals.

Example 30 may include the subject matter of any of Examples 27-29, and may further specify that: the storage element has a positive threshold voltage and a negative threshold voltage; a magnitude of the positive threshold voltage of the storage element is different from a magnitude of the negative threshold voltage of the storage element; when the magnitude of the first threshold voltage of the selector device is greater than the magnitude of the second threshold voltage of the selector device, the magnitude of the positive threshold voltage of the storage element is greater than the magnitude of the negative threshold voltage of the storage element; and when the magnitude of the first threshold voltage of the selector device is less than the magnitude of the second threshold voltage of the selector device, the magnitude of the positive threshold voltage of the storage element is less than the magnitude of the negative threshold voltage of the storage element.

Example 31 is a computing device, including: a circuit board; a processing device coupled to the circuit board; and a memory array coupled to the processing device, wherein the memory array includes a memory cell having a storage element coupled in series with a bipolar selector device having asymmetric threshold voltages.

Example 32 may include the subject matter of Example 31, and may further include a wireless communications controller coupled to the circuit board.

Example 33 may include the subject matter of any of Examples 31-32, and may further specify that the storage element has asymmetric set/reset voltages.

The invention claimed is:

1. A memory cell, comprising:

a storage element, wherein the storage element has a positive threshold voltage and a negative threshold voltage, and a magnitude of the positive threshold voltage of the storage element is different from a magnitude of the negative threshold voltage of the storage element; and a selector device coupled to the storage element, wherein the selector device has a positive threshold voltage and a negative threshold voltage, and a magnitude of the positive threshold voltage is different from a magnitude of the negative threshold voltage;

wherein the magnitude of the positive threshold voltage of the selector device is less than the magnitude of the negative threshold voltage of the selector device, and the magnitude of the positive threshold voltage of the storage element is less than the magnitude of the negative threshold voltage of the storage element.

2. The memory cell of claim 1, wherein the magnitude of the positive threshold voltage of the selector device is less than the magnitude of the positive threshold voltage of the storage element.

3. The memory cell of claim 2, wherein the magnitude of the negative threshold voltage of the selector device is less than the magnitude of the negative threshold voltage of the storage element.

4. The memory cell of claim 1, wherein the selector device includes first and second electrodes, a selector material is disposed between the first and second electrodes, and the first and second electrodes have different structures.

5. The memory cell of claim 4, wherein faces of the first and second electrodes facing the selector material have different surface areas.

6. The memory cell of claim 4, wherein the first and second electrodes are formed of different materials.

7. The memory cell of claim 4, wherein faces of the first and second electrodes facing the selector material have different work functions.

8. The memory cell of claim 7, wherein:

the first electrode includes tantalum and the second electrode includes platinum; or the first electrode includes hafnium and the second electrode includes cobalt; or the first electrode includes indium and the second electrode includes iridium.

9. The memory cell of claim 4, wherein faces of the first and second electrodes facing the selector material have different surface areas, and the first and second electrodes are formed of different materials.

10. The memory cell of claim 1, wherein the storage element is a resistive random access memory (RRAM) device.

11. The memory cell of claim 1, wherein the storage element is a metal filament storage element.

12. The memory cell of claim 1, wherein the memory cell includes a first terminal coupled to a bit line, and the memory cell includes a second terminal coupled to a word line.

13. A computing device, comprising:

a circuit board;

a processing device coupled to the circuit board; and a memory array coupled to the processing device, wherein the memory array includes a memory cell having a storage element coupled in series with a bipolar selector device having asymmetric threshold voltages, and the memory cell includes:

a storage element, wherein the storage element has a positive threshold voltage and a negative threshold voltage, and a magnitude of the positive threshold voltage of the storage element is different from a magnitude of the negative threshold voltage of the storage element, and a selector device coupled to the storage element, wherein the selector device has a positive threshold voltage and a negative threshold voltage, and a magnitude of the positive threshold voltage is different from a magnitude of the negative threshold voltage, wherein (1) the magnitude of the positive threshold voltage of the selector device is less than the magnitude of the negative threshold voltage of the selector device, and the magnitude of the positive threshold voltage of the storage element is less than the magnitude of the negative threshold voltage of the storage element, or (2) the magnitude of the positive threshold voltage of the selector device is less than the magnitude of the positive threshold voltage of the storage element.

14. The computing device of claim 13, wherein the storage element has asymmetric set/reset voltages.

15. The computing device of claim 13, wherein the storage element is a resistive random access memory (RRAM) device or a metal filament storage element.

16. The computing device of claim 13, further comprising:

wireless communication circuitry coupled to the circuit board.

17. A memory cell, comprising:

a storage element, wherein the storage element has a positive threshold voltage and a negative threshold voltage, and a magnitude of the positive threshold voltage of the storage element is different from a magnitude of the negative threshold voltage of the storage element; and a selector device coupled to the storage element, wherein the selector device has a positive threshold voltage and a negative threshold voltage, and a magnitude of the positive threshold voltage is different from a magnitude of the negative threshold voltage;

wherein the magnitude of the positive threshold voltage of the selector device is less than the magnitude of the positive threshold voltage of the storage element.

18. The memory cell of claim 17, wherein the magnitude of the positive threshold voltage of the selector device is greater than the magnitude of the negative threshold voltage of the selector device, and the magnitude of the positive threshold voltage of the storage element is greater than the magnitude of the negative threshold voltage of the storage element.

19. The memory cell of claim 17, wherein the selector device includes first and second electrodes, a selector material is disposed between the first and second electrodes, and the first and second electrodes have different structures.

20. The memory cell of claim 17, wherein the storage element is a resistive random access memory (RRAM) device.

* * * * *